(12) United States Patent
Isozaki et al.

(10) Patent No.: US 10,181,450 B2
(45) Date of Patent: Jan. 15, 2019

(54) METHOD OF MANUFACTURING SEMICONDUCTOR DEVICE

(71) Applicant: Renesas Electronics Corporation, Tokyo (JP)

(72) Inventors: Seiya Isozaki, Tokyo (JP); Takashi Moriyama, Tokyo (JP); Takehiko Maeda, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/421,461

(22) Filed: Feb. 1, 2017

(65) Prior Publication Data

US 2017/0287868 A1    Oct. 5, 2017

(30) Foreign Application Priority Data

Mar. 31, 2016    (JP) ................ 2016-073354

(51) Int. Cl.
*H01L 23/00* (2006.01)
*H01L 21/48* (2006.01)
*H01L 23/495* (2006.01)

(52) U.S. Cl.
CPC .......... *H01L 24/43* (2013.01); *H01L 21/4853* (2013.01); *H01L 23/4952* (2013.01); *H01L 23/49582* (2013.01); *H01L 24/03* (2013.01); *H01L 24/05* (2013.01); *H01L 24/27* (2013.01); *H01L 24/33* (2013.01); *H01L 24/48* (2013.01); *H01L 24/73* (2013.01); *H01L 24/45* (2013.01); *H01L 24/49* (2013.01); *H01L 2224/04042* (2013.01); *H01L 2224/05554* (2013.01); *H01L 2224/05624* (2013.01); *H01L 2224/32225* (2013.01); *H01L 2224/3303* (2013.01); *H01L 2224/45144* (2013.01); *H01L 2224/45147* (2013.01); *H01L 2224/48227* (2013.01); *H01L 2224/48247* (2013.01);
(Continued)

(58) Field of Classification Search
CPC . H01L 24/43; H01L 21/4853; H01L 23/4952; H01L 24/05
See application file for complete search history.

(56) References Cited

U.S. PATENT DOCUMENTS 6,727,590 B2 * 4/2004 Izumitani ............ H01L 23/5226
                                                       257/208
7,208,837 B2 * 4/2007 Wang .................... H01L 24/05
                                                       257/758
(Continued)

FOREIGN PATENT DOCUMENTS

JP    2012-227379 A    11/2012
JP    2014-033228 A    2/2014

*Primary Examiner* — Andres Munoz
(74) *Attorney, Agent, or Firm* — Mattingly & Malur, PC

(57) ABSTRACT

A pad formed in a semiconductor chip is formed such that a thickness of an aluminum film in a wire bonding portion is smaller than that of an aluminum film in a peripheral portion covered with a protective film. On the other hand, a thickness of a wiring formed in the same step as the pad is larger than that of the pad in the wire bonding portion. The main conductive film of the pad in the wire bonding portion is comprised of only one layer of a first aluminum film, while the main conductive film of the wiring is comprised of at least two layers of aluminum films (the first aluminum film and a second aluminum film) in any region of the wiring.

8 Claims, 16 Drawing Sheets

(52) U.S. Cl.
CPC ............ *H01L 2224/48465* (2013.01); *H01L 2224/49171* (2013.01); *H01L 2224/73215* (2013.01); *H01L 2224/73265* (2013.01); *H01L 2224/78301* (2013.01); *H01L 2224/8385* (2013.01); *H01L 2224/85181* (2013.01); *H01L 2224/92247* (2013.01); *H01L 2924/01029* (2013.01); *H01L 2924/01046* (2013.01); *H01L 2924/04941* (2013.01); *H01L 2924/15311* (2013.01); *H01L 2924/181* (2013.01)

(56) References Cited

U.S. PATENT DOCUMENTS

| | | | |
|---|---|---|---|
| 7,397,125 B2* | 7/2008 | Oda | H01L 23/53238 257/459 |
| 8,390,134 B2 | 3/2013 | Homma et al. | |
| 8,753,901 B2* | 6/2014 | Werner | H01L 22/32 257/48 |
| 10,002,808 B2* | 6/2018 | Abe | H01L 21/67092 |
| 2001/0008311 A1* | 7/2001 | Harada | H01L 24/03 257/758 |
| 2002/0005583 A1* | 1/2002 | Harada | H01L 24/03 257/758 |
| 2002/0014698 A1* | 2/2002 | Umemura | H01L 21/32051 257/758 |
| 2002/0163083 A1* | 11/2002 | Hatano | H01L 23/53223 257/762 |
| 2005/0001314 A1* | 1/2005 | Tanaka | H01L 23/53238 257/738 |
| 2008/0217786 A1* | 9/2008 | Kasaoka | G03F 1/32 257/773 |
| 2008/0277705 A1* | 11/2008 | Takahashi | H01L 21/76829 257/295 |
| 2010/0295044 A1* | 11/2010 | Homma | H01L 22/32 257/48 |
| 2012/0068278 A1* | 3/2012 | Knipe | H01H 1/0036 257/418 |
| 2013/0241067 A1* | 9/2013 | Furusawa | H01L 22/32 257/758 |
| 2014/0284790 A1* | 9/2014 | Matsumoto | H01L 22/32 257/737 |

* cited by examiner

METHOD OF MANUFACTURING SEMICONDUCTOR DEVICE

CROSS-REFERENCE TO RELATED APPLICATIONS

The disclosure of Japanese Patent Application No. 2016-073354 filed on Mar. 31, 2016 including the specification, drawings and abstract is incorporated herein by reference in its entirety.

BACKGROUND

The present invention relates to a method of manufacturing a semiconductor device, and can be preferably used for a method of manufacturing a semiconductor device, in which, for example, a wire comprised of copper is bonded to an electrode of a semiconductor chip.

There are known semiconductor devices in each of which a terminal (lead) provided on a base material such as a wiring board or a lead frame and an electrode (pad) of a semiconductor chip mounted over the base material (over a chip mounting region of the wiring board or over a die pad of the lead frame) are electrically connected with each other via a conductive wire (e.g., Patent Documents 1 and 2).

In these semiconductor devices, the electrode of the semiconductor chip includes, for example, aluminum (Al).

RELATED ART DOCUMENT

Patent Document

[Patent Document 1] Japanese Unexamined Patent Application Publication No. 2014-033228
[Patent Document 2] Japanese Unexamined Patent Application Publication No. 2012-227379

SUMMARY

In a semiconductor device as described above, when a wire including copper (Cu) is used, that is, when a wire including copper is bonded to an electrode (pad) including aluminum of a semiconductor chip, part of the electrode (a portion to which the wire is bonded) of the semiconductor chip is more likely to be excluded (also referred to as "splash out") than the case where a wire including Au is used.

When the above splash out occurs, there is the fear that: part of the excluded electrode may contact and damage an insulating film (passivation film) covering the peripheral portion of the electrode of the semiconductor chip, whereby the reliability of the semiconductor device may be impaired.

Other problems and new characteristics will become clear from the description and accompanying drawings of the present specification.

A method of manufacturing a semiconductor device according to one embodiment includes the step of electrically connecting a pad of a semiconductor chip mounted over a base material with a terminal of the base material via a wire including copper, and the step of forming the pad of the semiconductor chip includes the steps of: forming the pad and a wiring by patterning a laminated film having a first conductive layer comprised of aluminum, a second conductive layer that includes a material different from the first conductive layer and is stacked over the first conductive layer, and a third conductive layer that includes the same material as the first conductive layer and is stacked over the second conductive layer; patterning an insulating film covering the pad and the wiring to expose part of the pad from the insulating film; and etching the part of the pad exposed from the insulating film to expose the first conductive layer.

According to one embodiment, the reliability of a semiconductor device can be improved.

DETAILED DESCRIPTION

Figure 1:
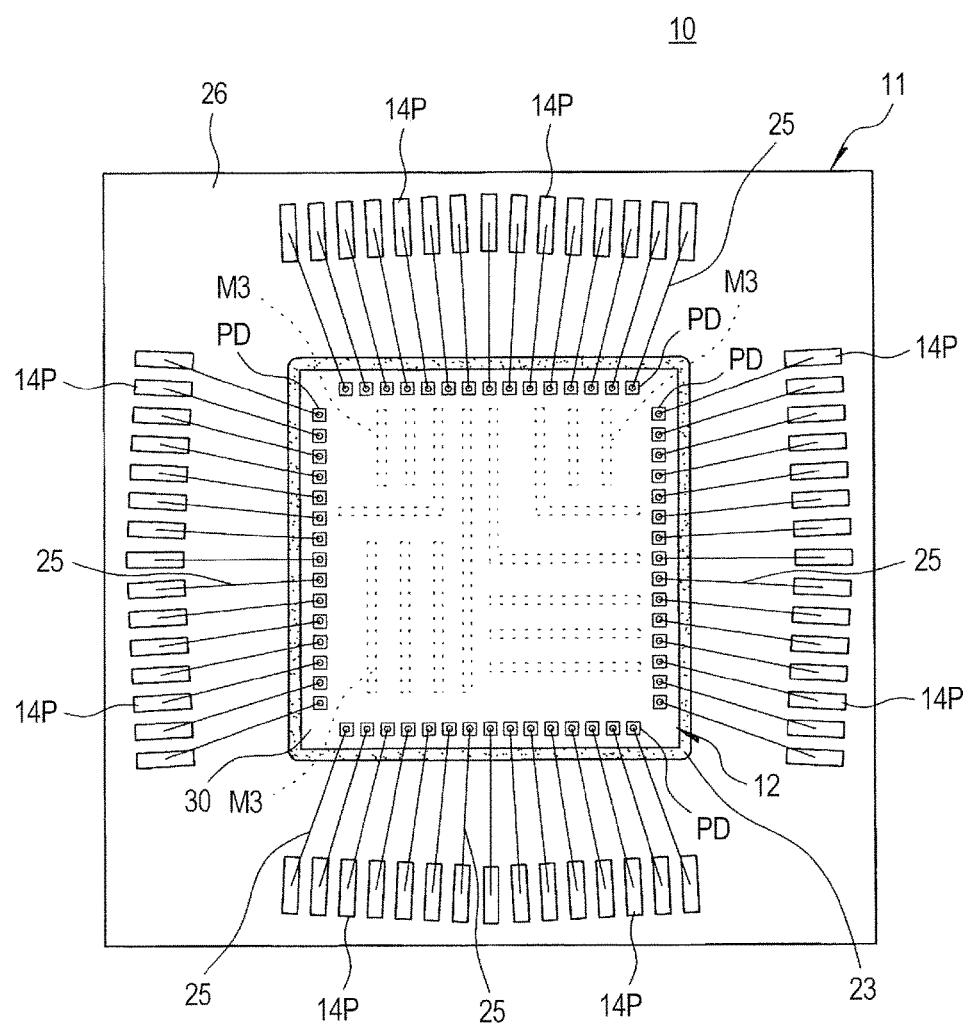
FIG. 1 is a plan view illustrating a semiconductor chip of a semiconductor device according to First Embodiment.

Hereinafter, preferred embodiments will be described in detail based on the accompanying views. In each view for explaining the embodiments, components having the same function will be denoted with the same reference numerals, and duplicative description thereof will be omitted. Additionally, in the embodiments, description of the same or similar parts will not be repeated in principle, unless it is particularly necessary. Further, in the views for explaining the embodiments, hatching may be given to a plan view or hatching in a sectional view may be omitted, in order to make a configuration easy to understand.

(First Embodiment)

<Semiconductor Device>

Figure 2:
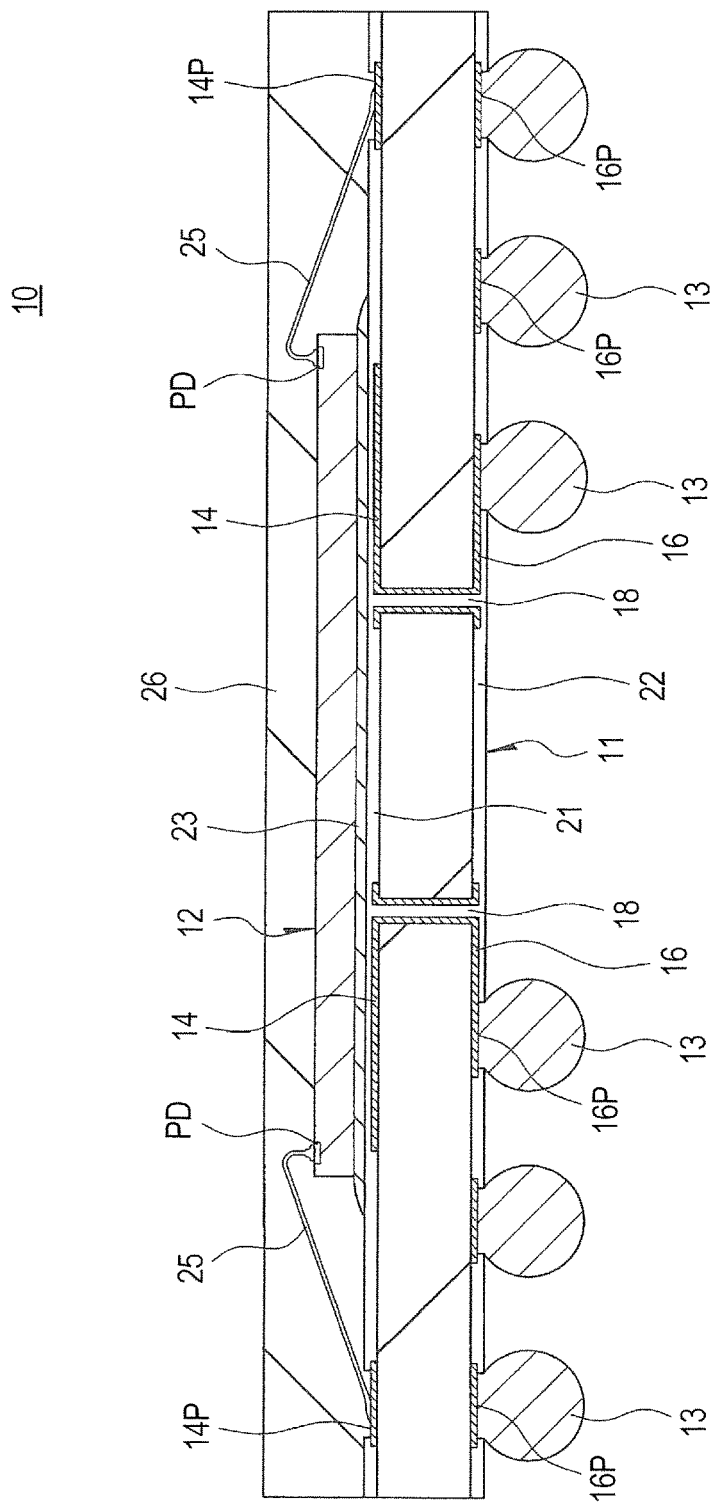
FIG. 2 is a sectional view illustrating the semiconductor device according to First Embodiment.

FIG. 1 is a schematic plan view illustrating a semiconductor device according to First Embodiment. FIG. 2 is a sectional view of the semiconductor device of FIG. 1. In FIG. 1, illustration of a sealing body covering the upper surface of a wiring board is omitted.

A semiconductor device 10 of First Embodiment is a BGA (Ball Grid Array) type semiconductor device in which: a semiconductor chip 12 is mounted over the upper surface of a wiring board 11 that is a base material; and a plurality of external terminals 13 each including a solder ball (solder material, bump electrode) are formed over the lower surface (mounting surface) of the wiring board 11.

The wiring board 11 includes two layers of wirings (a plurality of upper surface wirings 14 and a plurality of lower surface wirings 16) over the upper and lower surfaces of an insulating material (so-called glass epoxy resin) molded, for example, by impregnating glass fibers with a synthetic resin such as epoxy resin. The upper surface of the wiring board 11 is covered with a solder resist (insulating film) 21 for protecting the upper surface wirings 14, and the lower surface of the wiring board 11 is covered with a solder resist (insulating film) 22 for protecting the lower surface wirings 16. The upper surface wiring 14 and the lower surface wiring 16 include copper (Cu), and are electrically connected with each other via a through-hole (via) 18 provided in the insulating material.

Over the upper surface of the wiring board 11, a plurality of bonding leads (terminals) 14P, each removing the solder resist 21 to expose part of the upper surface wiring 14, are formed. Over the lower surface of the wiring board 11, a plurality of bump lands (electrodes) 16P, each removing the solder resist 22 to expose part of the lower surface wiring 16, are provided. Although not illustrated, a plating film formed by a laminated film of, for example, a nickel (Ni) film and a gold (Au) film is formed over the surface of each of the plurality of bonding leads 14P and the plurality of the bump lands 16P.

The semiconductor chip 12 having a rectangular planar shape is mounted (die bonded) over (to) the central portion (chip mounting region) of the upper surface of the wiring board 11. The semiconductor chip 12 is arranged over the central portion of the upper surface of the wiring board 11 in a state where the back surface thereof faces to the upper surface of the wiring board 11, and is fixed to the surface of the solder resist 21 via a die bonding material (adhesive) 23.

Over the main surface (front surface) CS of the semiconductor chip 12 and in the peripheral portion of the main surface CS having a substantially rectangular planar shape as illustrated in FIG. 1, a plurality of pads (electrodes) PD are arranged in a line along each side. Each of the pads PD and each of the bonding leads 14P formed over the upper surface of the wiring board 11 are electrically connected with each other via a wire (conductive member) 25 including copper.

Figure 3:
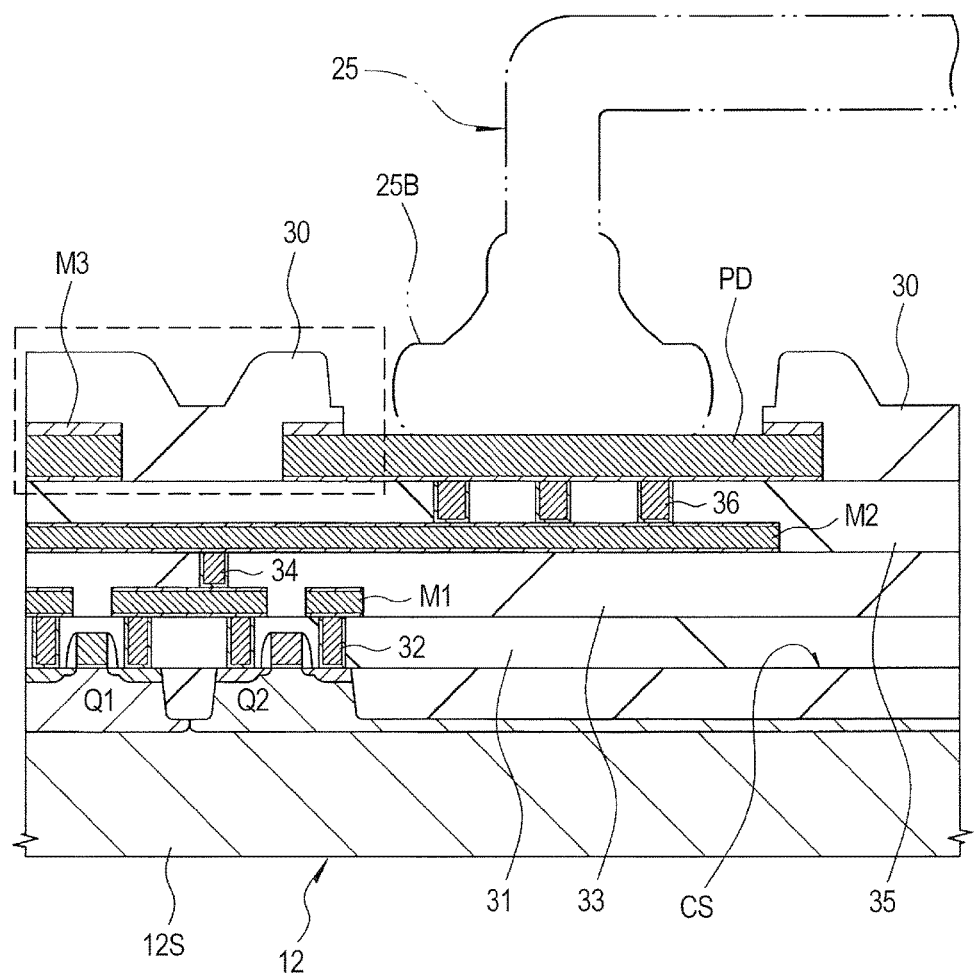
FIG. 3 is an essential-part sectional view illustrating the semiconductor chip of the semiconductor device according to First Embodiment.

In a region (internal circuit region) surrounded by the pads PD formed in the peripheral portion of the main surface of the semiconductor chip 12, a plurality of wirings M3 including a power supply wiring and a reference power supply wiring are formed, as illustrated in FIG. 1. The pads PD and the wirings M3 are formed in the uppermost wiring layer, of a plurality of wiring layers (multilayer wiring layers) formed over the main surface (the surface over which the semiconductor elements Q1 and Q2 illustrated in FIG. 3 are formed) CS of the semiconductor chip 12, that is, formed in a wiring layer formed over the surface of an insulating layer 35 located, of a plurality of insulating layers formed between a wiring layer and another wiring layer located over the wiring layer, in the uppermost portion; and each of them includes a conductive material containing aluminum (Al) as a main component.

Over the surface of the insulating layer 35 located in the uppermost portion of the plurality of insulating layers formed over the main surface CS of the semiconductor chip 12, a protective film (an insulating film, a passivation film) 30 for shielding an integrated circuit from external foreign matters and moisture is formed.

The upper surface of the wiring board 11, the semiconductor chip 12, and a plurality of wires 25 are sealed by a sealing body 26. The sealing body 26 includes, for example, an epoxy resin-based thermosetting resin containing silicon fillers, and is molded by a transfer molding process.

The semiconductor device 10 is mounted over a non-illustrated mounting board (mother board) via the external terminals 13 each including a solder ball formed over the lower surface of the wiring board 11. That is, the wiring board 11 of the semiconductor device 10 functions as an interposer substrate for connecting the semiconductor chip 12 mounted over the upper surface thereof with the mother board (mounting board).

The solder ball 13 that forms the external terminal of the semiconductor device 10 is formed by so-called lead-free solder that does not substantially contain lead (Pb), such as, for example, tin (Sn), a tin-bismuth (Sn—Bi) alloy, or a tin-copper-silver (Sn—Cu—Ag) alloy.

FIG. 3 is a sectional view illustrating a configuration of the peripheral portion (a region where the pads PD are arranged) of the semiconductor chip 12 illustrated in FIGS. 1 and 2.

Over the main surface CS of a semiconductor substrate 12S including monocrystalline silicon, a plurality of semiconductor elements each including a MISFET (Metal Insulator Semiconductor Field Effect Transistor), and the like are formed. A first semiconductor element Q1 and a second semiconductor element Q2 are illustrated in FIG. 3, as representatives of the semiconductor elements.

Both multilayer wirings (herein, three layers of wirings M1, M2, and M3) for electrically connecting the semiconductor elements Q1 and Q2 with each other and the pads PD electrically connected with the semiconductor elements Q1 and Q2 via the multilayer wirings are formed above the semiconductor elements Q1 and Q2. That is, the semiconductor elements Q1 and Q2 are electrically connected with the first layer wirings M1 via metal plugs 32 formed in an insulating layer 31, and the first layer wirings M1 are electrically connected with the second layer wirings M2 via metal plugs 34 formed in an insulating layer (interlayer insulating film) 33. Further, the second layer wirings M2 are electrically connected with either the third layer wirings M3 or the pads PD via metal plugs 36 formed in an insulating layer (interlayer insulating film) 35.

Herein, the three layers of the wirings (M1, M2, M3) are illustrated as one example of the multilayer wirings, but they may be four or more layers of multilayer wirings.

Each of the first layer wiring M1 and the second layer M2 is comprised of: a conductive material containing aluminum as a main component, for example, an aluminum film (or an aluminum-copper alloy film); a barrier metal film including a laminated film of a titanium (Ti) film and a titanium nitride (TiN) film, formed under the aluminum film; and an etching stopper film including a titanium film, formed over the aluminum film. Each of the metal plugs 32, 34, and 36 includes a conductive material containing, for example, tungsten (W) as a main component, and each of the insulating layers 31, 33, and 35 includes, for example, a silicon oxide film.

A protective film 30, for exposing part of the pad PD and covering the peripheral portion of the pad PD and the third layer wiring M3, is formed over the surface of the insulating layer 35 covering the second layer wiring M2. A ball portion 25B, which is one end (first portion) of the wire 25 including copper, is electrically connected with part of the pad PD exposed from the protective film 30. The thickness (width) of the ball portion 25B in the present embodiment is larger than the width (diameter) of the portion of the wire 25 other than the ball portion, as illustrated in FIG. 3. Hereinafter, a region of the surface of the pad PD exposed from the protective film 30, that is, a region with which the ball portion 25B of the wire 25 is connected is referred to as a wire bonding surface or a wire bonding portion.

Although not illustrated in FIG. 3, the surface of the protective film 30, the region of the wire bonding surface of the pad PD that is not covered with the ball portion 25B of the wire 25, and the wire 25 are covered with the sealing body 26 (see FIG. 2).

<Manufacturing Method of Semiconductor Chip>

Next, a method of manufacturing the semiconductor chip 12 (particularly, the pad PD) of First Embodiment configured as described above will be described.

Figure 4:
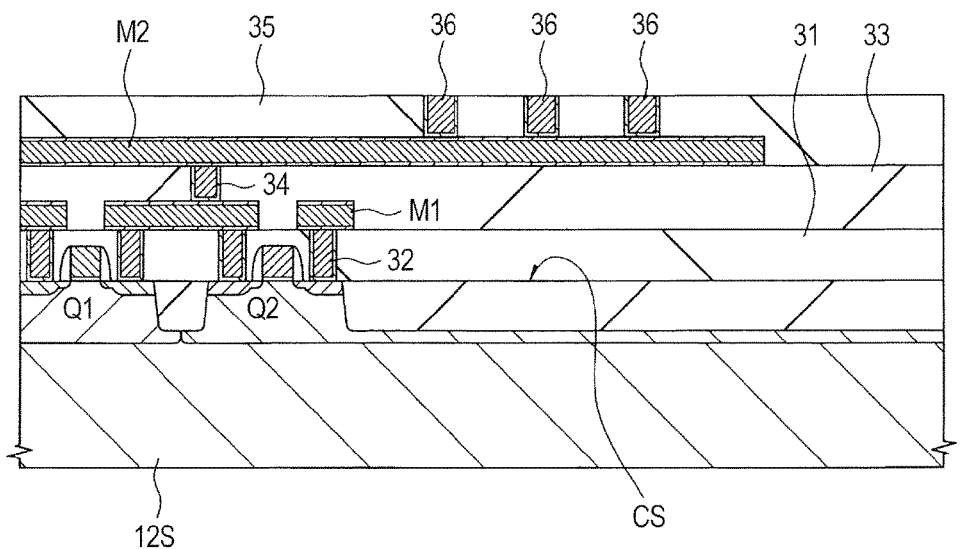
FIG. 4 is a sectional view illustrating a method of manufacturing the semiconductor device according to First Embodiment.

FIG. 4 illustrates a sectional surface in which after the semiconductor elements (the first semiconductor element Q1 and the second semiconductor element Q2) are formed over the main surface of the semiconductor substrate 12S, the insulating layer 31, the metal plug 32, the first layer wiring M1, the insulating layer 33, the metal plug 34, the second layer wiring M2, the insulating layer 35, and the metal plug 36 are sequentially formed above the semiconductor elements. The semiconductor substrate 12S is a substrate that has a substantially circular planar shape and is referred to as a semiconductor wafer at this stage.

1-1. Step of Forming Uppermost Wiring Layer

First, the step of forming the pad PD and the third layer wiring M3 in the upper portion of the insulating layer 35 (a portion where the uppermost wiring layer is formed) will be described in detail with reference to FIGS. 5 to 12. Herein, FIGS. 5 to 12 are sectional views corresponding to the region surrounded by the rectangular dashed line illustrated in FIG. 3 (a region including part of the pad PD and part of the wiring M3).

Figure 5:
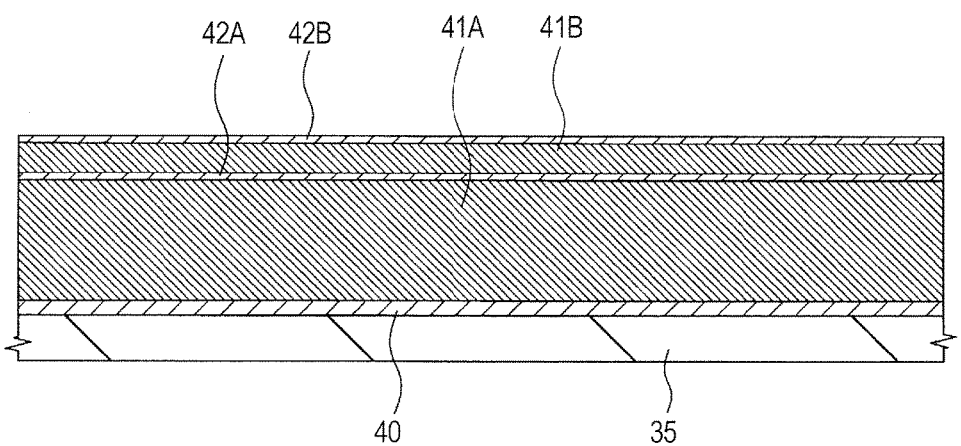
FIG. 5 is an essential-part sectional view illustrating a method of manufacturing the semiconductor device, following FIG. 4.

As illustrated in FIG. 5, a barrier metal film 40 including a laminated film of a titanium (Ti) film and a tantalum nitride (TaN) film is deposited over the surface of the insulating layer 35 by a sputtering process, and then an aluminum film (first conductive layer) 41A, a titanium nitride (TiN) film (second conductive layer) 42A, an aluminum film (third conductive layer) 41B, and a titanium nitride film (fourth conductive layer) 42B are sequentially deposited above the barrier metal film 40.

The tantalum nitride (TaN) film that forms part of the barrier metal film 40 is a conductive film for preventing the diffusion of aluminum that is a main component of each of the pad PD and the wiring M3. However, because the electrical resistance of tantalum nitride is higher than that of aluminum, if the barrier metal film 40 is formed only by a tantalum nitride film, the electrical resistance of each of the pad PD and the wiring M3 is increased, which hinders high-speed operation of a semiconductor device. Therefore, an increase in wiring resistance is suppressed by forming the barrier metal film 40 by a laminated film of a titanium film and a tantalum nitride film, in First Embodiment. The barrier metal film 40 may be formed by a laminated film of a titanium film and a titanium nitride film, and its thickness is, for example, 0.2 µm.

The first aluminum film 41A above the barrier metal film 40 is the main conductive film of each of the pad PD and the wiring M3, and its thickness is, for example, 0.8 µm.

The titanium nitride film 42A above the first aluminum film 41A is an etching stopper film for controlling the thickness of the first aluminum film 41A, which is the main conductive film of the pad PD, in the later-described step of processing the pad PD, and its thickness is, for example, 0.075 µm.

The second aluminum film 41B above the titanium nitride film 42A is the main conductive film of each of the pad PD and the wiring M3, similarly to the lower first aluminum film 41A, and its thickness is, for example, 0.625 µm.

The titanium nitride film 42B above the second aluminum film 41B is an etching stopper film for preventing the second aluminum film 41B, which is the main conductive film of the PD, from being etched when part of the surface of the pad PD is exposed by etching a first protective film 30A formed over the surface of the pad PD in the later-described step, and its thickness is, for example, 0.075 µm.

Meanwhile, an increase in the number of pads and a reduction in the pitch between adjacent pads are simultaneously advancing in recent semiconductor devices, accompanying the miniaturization and higher functionality of semiconductor chips, and hence the line width of the uppermost layer wiring including pads becomes fine. However, the uppermost layer wirings formed in the same layer as the pads are also wirings including a power supply wiring and a reference power supply wiring through which a large current flows, and hence the miniaturization of the line width causes an increase in electrical resistance, which may become a factor for which an improvement in the electrical property of a semiconductor device is hindered.

Therefore, there is a tendency in the recent semiconductor devices, in which the thickness of an aluminum film, the main conductive film of the uppermost layer wiring, is made larger in order to suppress an increase in electrical resistance accompanying the miniaturization of the line width. As a result, the thickness of a pad formed in the same layer as the uppermost layer wiring tends to become larger.

Also, in the semiconductor device 10 according to First Embodiment, the total thickness of the two layers of the aluminum films (the first aluminum film 41A and the second aluminum film 41B), the main conductive films of the wiring M3, is made as large as, for example, 0.8 µm+0.625 µm=1.425 µm, from the viewpoint of suppressing an increase in the electrical resistance accompanying the miniaturization of the line width of the wiring M3.

1-2. First Etching Step

Figure 6:
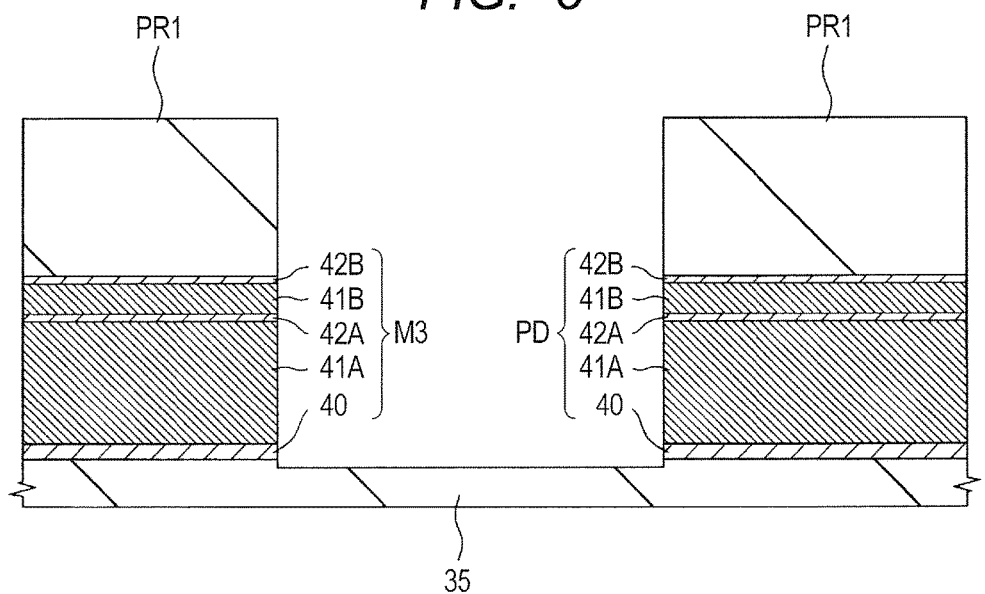
FIG. 6 is an essential-part sectional view illustrating a method of manufacturing the semiconductor device, following FIG. 5.

Next, by dry etching the titanium nitride film 42B, the second aluminum film 41B, the titanium nitride film 42A, the first aluminum film 41A, and the barrier metal film 40 with the use of a photoresist film PR1 formed above the titanium nitride film 42B as a mask, the pad PD and the wiring M3, each including a laminated film of these five layers (the barrier metal film 40, the first aluminum film 41A, the titanium nitride film 42A, the second aluminum film 41B, and the titanium nitride film 42B), are formed, as illustrated in FIG. 6.

1-3. Step of Forming Insulating Film

Figure 7:
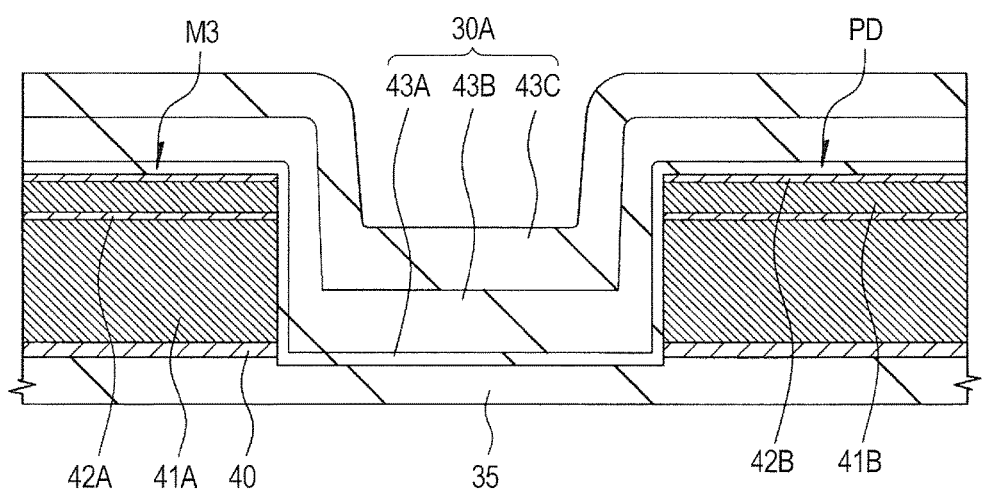
FIG. 7 is an essential-part sectional view illustrating a method of manufacturing the semiconductor device, following FIG. 6.

Next, the first protective film 30A covering the surface of each of the insulating layer 35, the pad PD, and the wiring M3 is deposited after the photoresist film PR1 is removed, as illustrated in FIG. 7. The first protective film 30A includes a laminated film of a silicon oxide film 43A deposited, for example, by a plasma CVD (Plasma-enhanced chemical vapor deposition) process, a silicon oxide film 43B deposited by a high-density plasma CVD process, and a silicon oxide film 43C deposited by a plasma CVD process using TEOS (Tetra Ethyl Ortho Silicate; $Si(OC_2H_5)_4$) and ozone ($O_3$) as sauce gas, and its thickness is, for example, 1.9 μm.

1-4. Second Etching Step

Figure 8:
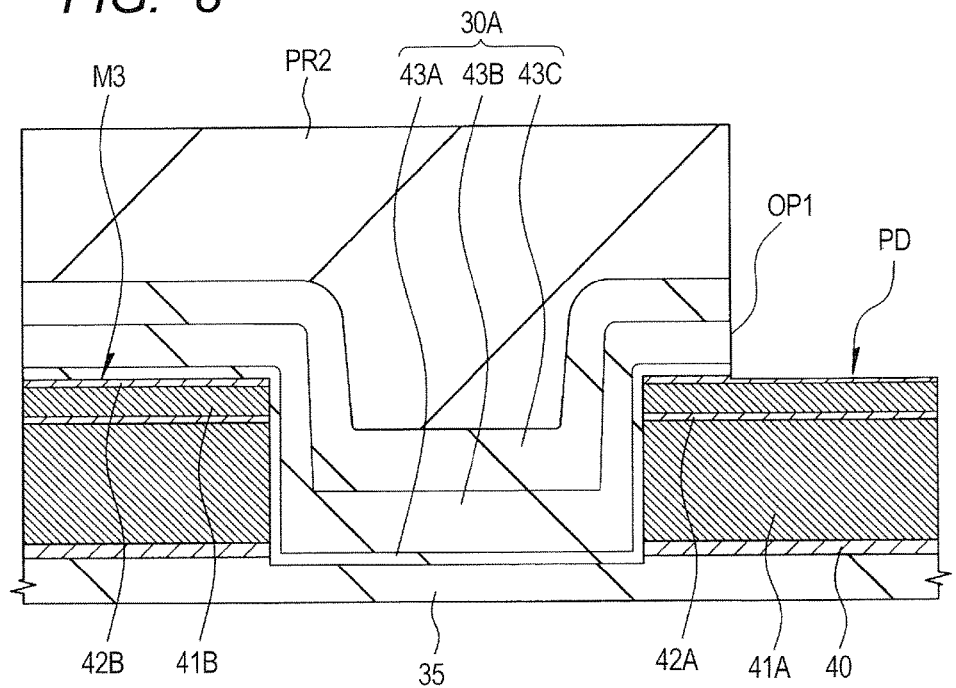
FIG. 8 is an essential-part sectional view illustrating a method of manufacturing the semiconductor device, following FIG. 7.

Next, an opening OP1 is formed in the first protective film 30A above the pad PD by dry etching using a photoresist film PR2 formed above the first protective film 30A as a mask, whereby part (a region excluding the peripheral portion) of the surface of the pad PD is exposed, as illustrated in FIG. 8. In dry etching the first protective film 30A, the scraping of the surface (the titanium nitride film 42B) of the PD is suppressed by using an etching gas having a high selection ratio to the insulating film (the first protective film 30A), for example, a mixed gas (first gas) of $CF_4$, $CHF_3$, $N_2$, and Ar, so that the second aluminum film 41B, which is the main conductive film of the pad PD, is not scraped.

Although the scraping of the titanium nitride film 42B can be suppressed by using the above mixed gas (first gas), the titanium nitride film 42B may be slightly etched depending on the amount and time at and during which the mixed gas is supplied, as illustrated in FIG. 8. The above titanium nitride film 42B should not necessarily be left, but it may be removed in this etching step, and further the second aluminum film 41B located below the titanium nitride film 42B (on the insulating layer 35 side) may be slightly etched. This makes it possible to omit, when the titanium nitride film 42B cannot be completely removed in a subsequent etching step (third etching step), an additional etching step for removing the remaining titanium nitride film 42B.

1-3. Step of Forming Insulating Film

Figure 9:
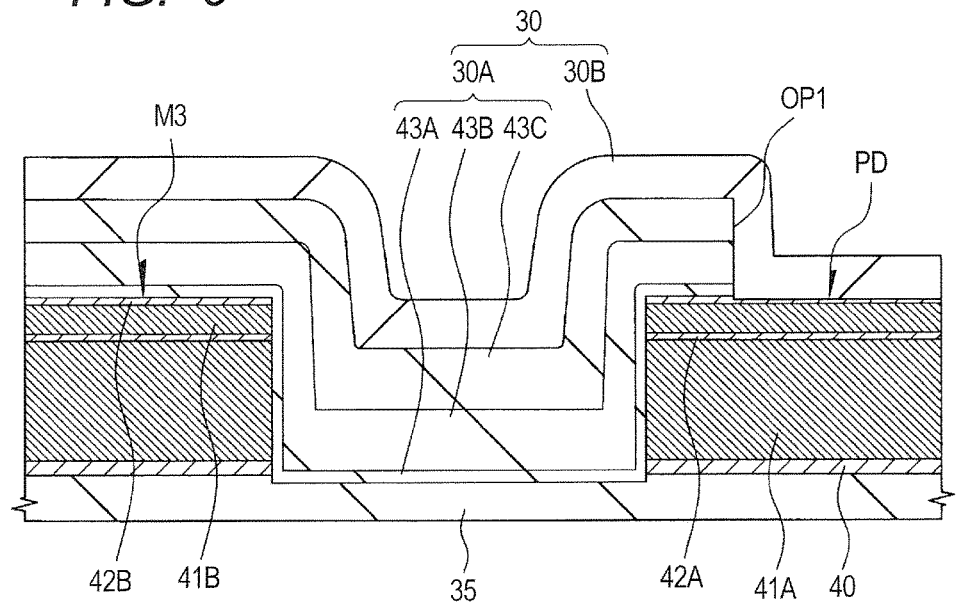
FIG. 9 is an essential-part sectional view illustrating a method of manufacturing the semiconductor device, following FIG. 8.

Next, a second protective film 30B covering the surface of each of the first protective film 30A and the pad PD is deposited after the photoresist film PR2 is removed, as illustrated in FIG. 9. The second protective film 30B includes a silicon nitride film deposited, for example, by a plasma CVD process, and its thickness is, for example, 0.6 μm. Thereby, the surface of each of the insulating layer 35, the wiring M3, and the peripheral portion of the pad PD is covered with the protective film 30 comprised of a laminated film of the first protective film 30A that is a silicon oxide-based insulating film and the second protective film 30B including a silicon nitride film. Part (a region excluding the peripheral portion) of the surface of the pad PD is covered with the second protective film 30B.

1-6. Third Etching Step

Figure 10:
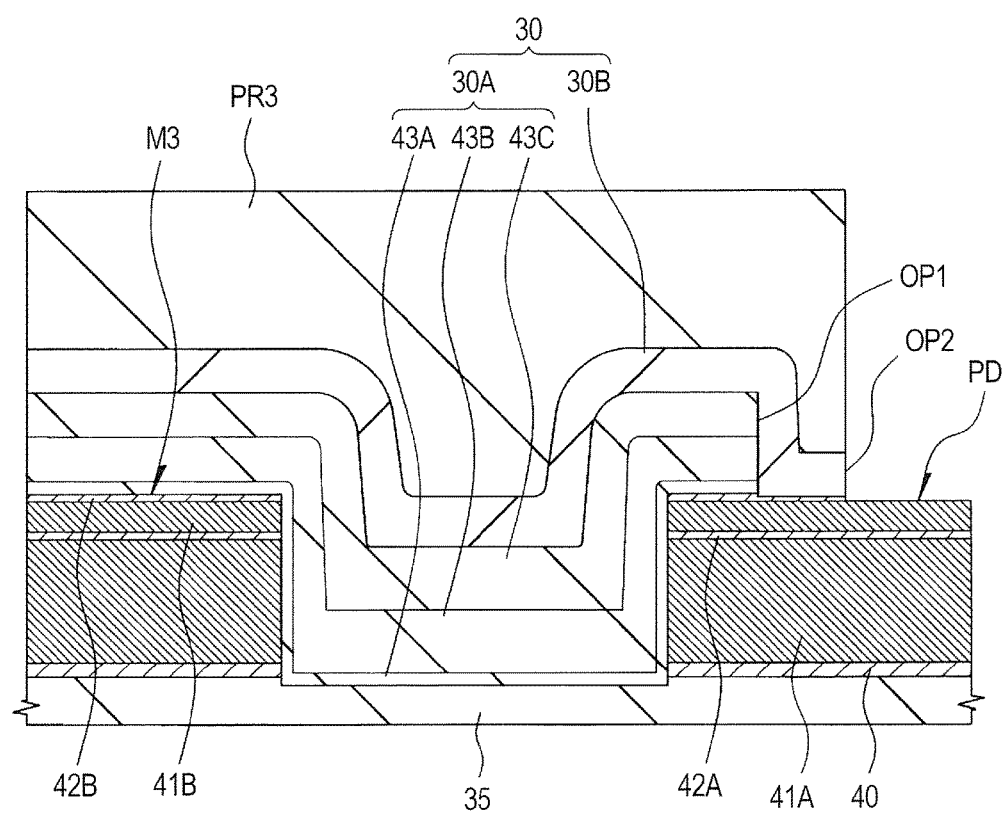
FIG. 10 is an essential-part sectional view illustrating a method of manufacturing the semiconductor device, following FIG. 9.

Next, an opening OP2 is formed in the second protective films 30B above the pad PD by dry etching using a photoresist film PR3 formed above the second protective film 30B as a mask, whereby part of the surface of the pad PD (wire bonding portion) is exposed, as illustrated in FIG. 10.

In this dry etching step, the second aluminum film 41B, which is the main conductive film of the pad PD, may be exposed with almost the titanium nitride film 42B remaining in part of the surface (wire bonding portion) of the pad PD being scraped. However, in order to minimize the scraping of the second aluminum film 41B, it is desirable to etch the second protective film 30B by using an etching gas having a high selection ratio to the insulating film, like one used in the above dry etching step for the first protective film 30A (see FIG. 8).

1-7. Fourth Etching Step

Figure 11:
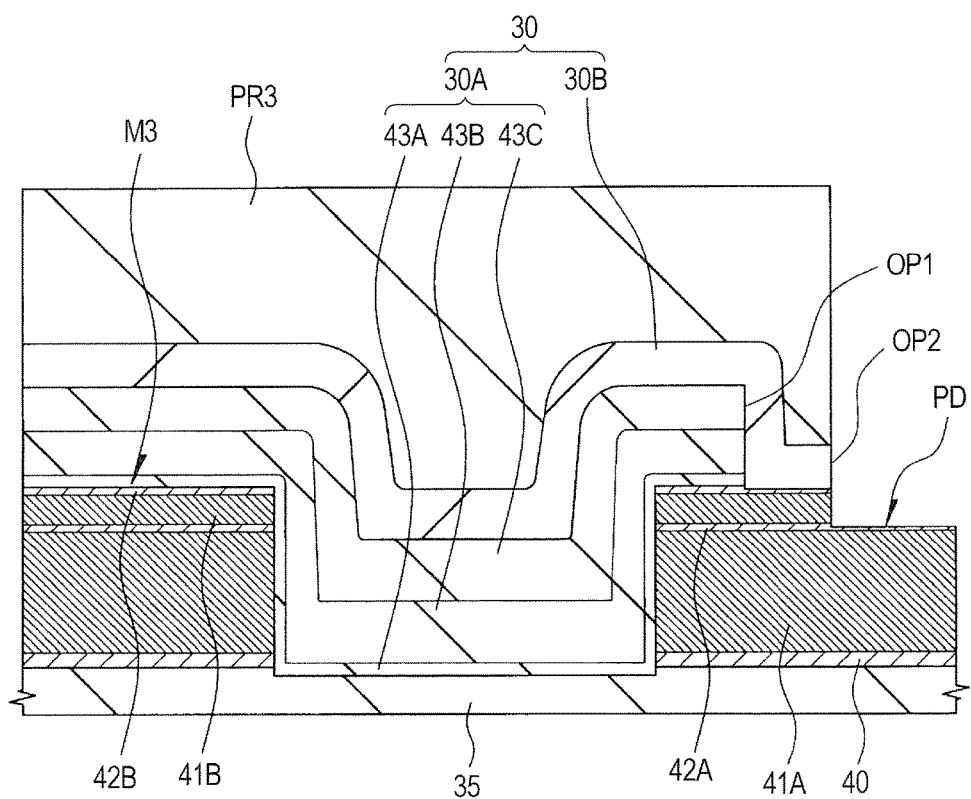
FIG. 11 is an essential-part sectional view illustrating a method of manufacturing the semiconductor device, following FIG. 10.

Next, the second aluminum film 41B in the wire bonding portion of the pad PD is removed by dry etching using the photoresist film PR3 left above the second protective film 30B as a mask, so that the surface of the lower titanium nitride film 42A is exposed, as illustrated in FIG. 11.

In this dry etching step, in order to prevent the titanium nitride film 42A under the second aluminum film 41B from being scraped and also prevent the lower first aluminum film 41A from being etched, the scraping of the titanium nitride film 42A is suppressed by using an etching gas having a high selection ratio to an aluminum film and a low selection ratio to a titanium nitride film, for example, a mixed gas (second gas) of $Cl_2$, $BCl_3$, $CH_2$, $C_2H_4$, and He, so that the first aluminum film 41A, the main conductive film of the pad PD, is not scraped.

The scraping of the titanium nitride film 42A can be suppressed by using the above mixed gas (second gas), but the titanium nitride film 42A may be slightly etched depending on the amount and time at and during which the mixed gas is supplied, as illustrated in FIG. 11. The above titanium nitride film 42A should not necessarily be left, but it may be removed in this etching step, and further the first aluminum film 41A located below the titanium nitride film 42A (on the insulating layer 35 side) may be slightly etched. Thereby, a subsequent etching step (fifth etching step) can be omitted.

1-8. Fifth Etching Step

Figure 12:
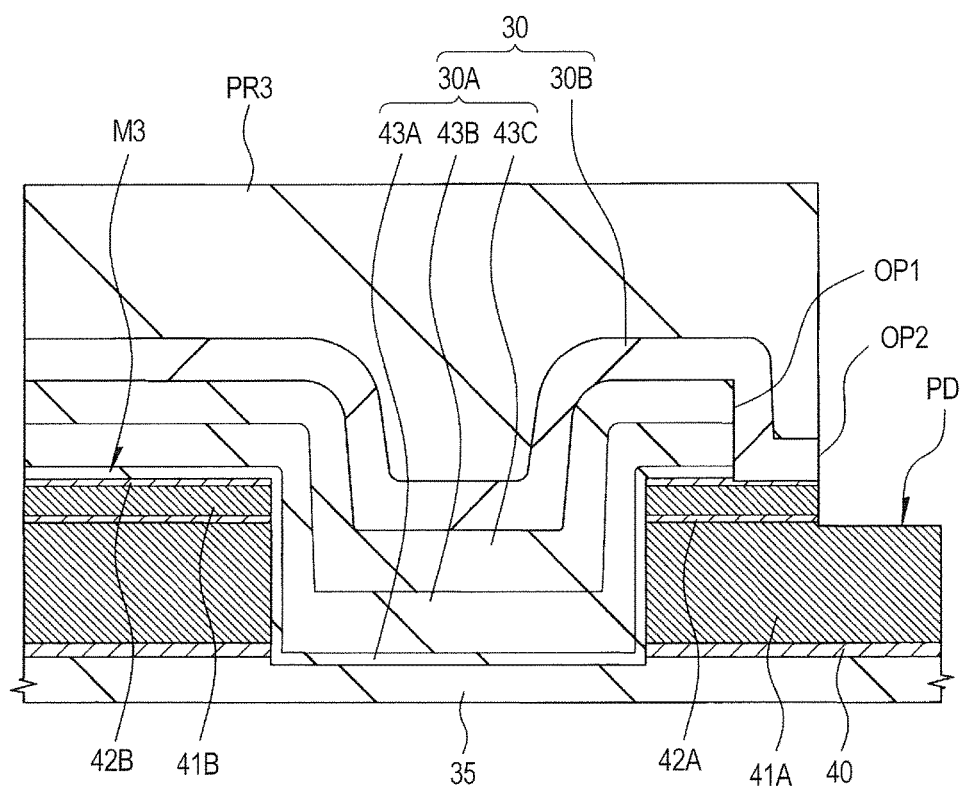
FIG. 12 is an essential-part sectional view illustrating a method of manufacturing the semiconductor device, following FIG. 11.

Next, the titanium nitride film 42A exposed in the wire bonding portion of the pad PD is removed by dry etching using the photoresist film PR3 left above the second protective film 30B as a mask, so that the surface of the first aluminum film 41A is exposed, as illustrated in FIG. 12.

In order to prevent the scraping of the first aluminum film 41A under the titanium nitride film 42A, an etching gas having a high selection ratio to a titanium nitride film and a low selection ratio to an aluminum film, for example, a mixed gas (third gas) of $Cl_2$, $CH_2$, $C_2H_4$, and He is used in this dry etching step. Accordingly, the scraping of the first aluminum film 41A, which is the main conductive film, is suppressed.

The scraping of the first aluminum film 41A can be suppressed by using the above mixed gas (third gas), but the first aluminum film 41A may be slightly etched depending on the amount and time at and during which the mixed gas is supplied, as illustrated in FIG. 12.

The thickness of the first aluminum film 41A left in the wire bonding portion of the pad PD can be controlled with high accuracy by interposing the titanium nitride film 42A, which is an etching stopper film, between the two layers of the first aluminum film 41A and the second aluminum film 41B that are main conductive films, and by sequentially etching the second aluminum film 41B and the titanium nitride film 42A with the use of two types of etching gases (second gas and third gas) having different etching selection ratios to the titanium nitride film 42A and the two layers of the aluminum films (the first aluminum film 41A, the second aluminum film 41B), as described above.

In this embodiment, the second aluminum film 41B and the titanium nitride film 42A of the pad PD are sequentially dry etched by using the photoresist film PR3 used in the dry etching step (see FIG. 10) for the second protective film 30B as a mask. However, when there is the fear that the quality of the photoresist film PR3 may be deteriorated or the resist pattern may be deformed by performing a plurality of dry etching steps as described above, the photoresist film PR3 may be removed after the second protective film 30B is dry etched, and the second aluminum film 41B and the titanium nitride film 42A may be dry etched by using the second protective film 30B as a hard mask.

Also in this embodiment, after the surface of the lower titanium nitride film 42A is exposed by dry etching the second aluminum film 41B, the titanium nitride film 42A is dry etched by changing an etching gas, but when the thickness of the lower titanium nitride film 42A is made small with the surface thereof being scraped to some extent in the dry etching step for the second aluminum film 41B, a subsequent dry etching step for the titanium nitride film 42A may be omitted.

Also in this embodiment, the protective film 30 is formed by a laminated film of the first protective film 30A that is a silicon oxide-based insulating film and the second protective film 30B including a silicon nitride film, but the protective film 30 may be formed only by a silicon oxide-based insulating film or only by a silicon nitride film.

Also in this embodiment, the titanium nitride film 42A is used as an etching stopper film for dry etching the second aluminum film 41B, but, for example, a titanium film, tantalum film, or tantalum nitride film may be used as an etching stopper film for dry etching the second aluminum film 41B.

Figure 13:
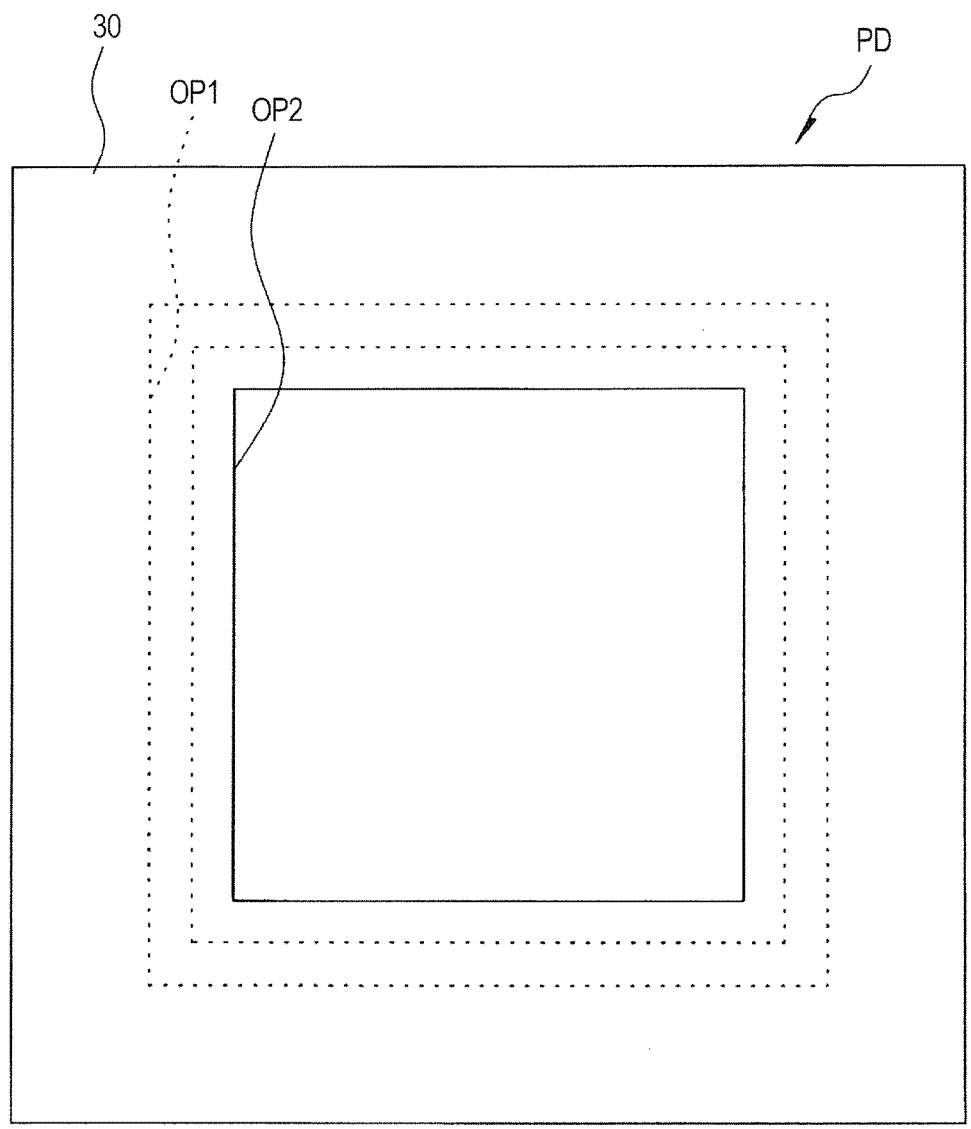
FIG. 13 is a plan view illustrating a pad structure of the semiconductor device according to First Embodiment.
Figure 14:
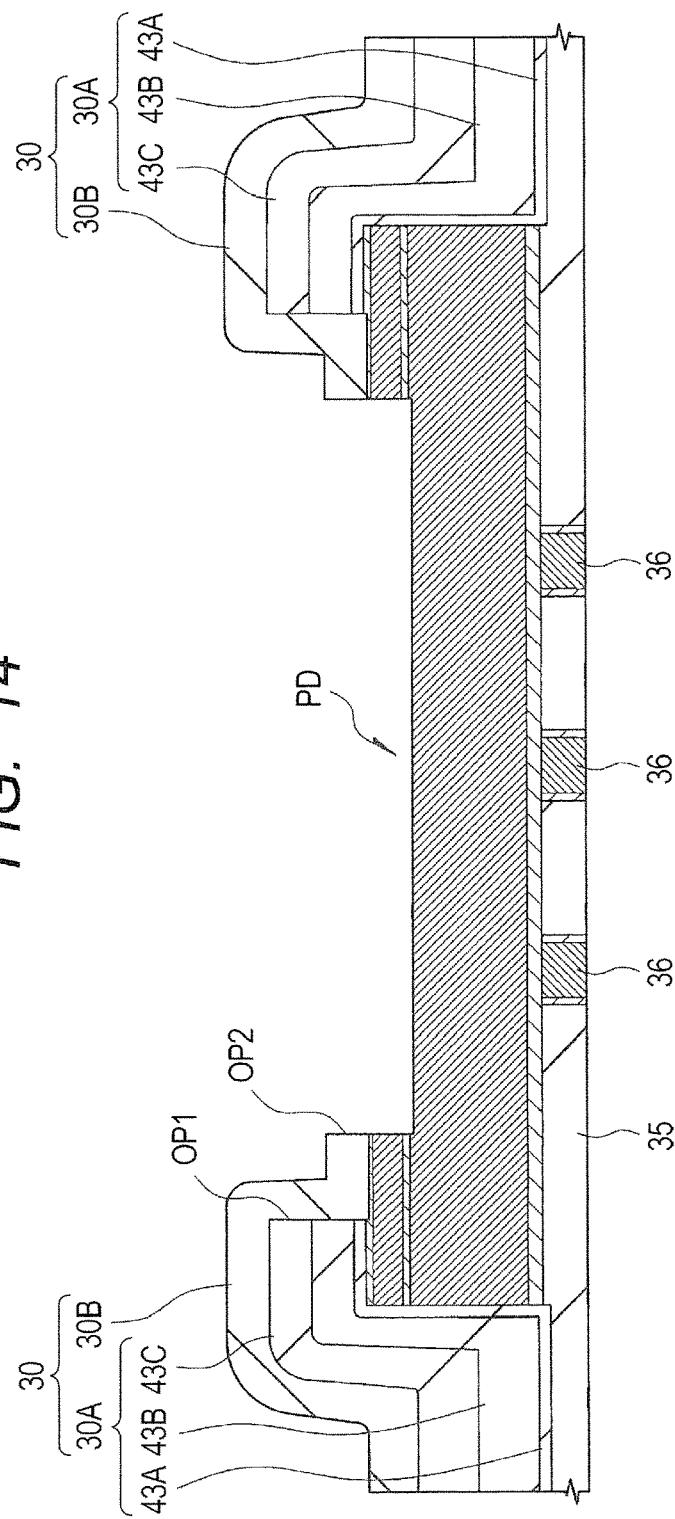
FIG. 14 is a sectional view illustrating a pad structure of the semiconductor device according to First Embodiment.

FIG. 13 is a plan view of the pad PD formed in the above steps. FIG. 14 is a sectional view of the pad PD formed in the above steps.

As illustrated in FIG. 14, the characteristic of the pad PD of First Embodiment is that the thickness of the aluminum film in the wire bonding portion is smaller than that of the aluminum film in the peripheral portion covered with the protective film 30.

On the other hand, the thickness of the wiring M3 formed in the same step as the pad PD is larger than that of the pad PD in the wire bonding portion. That is, the main conductive film of the pad PD in the wire bonding portion is comprised of only one layer of the first aluminum film 41A, but the main conductive film of the wiring M3 is comprised of two layers of the aluminum films (the first aluminum film 41A and the second aluminum film 41B) in any region of the wiring M3.

Although the planar shape of the pad PD illustrated in FIG. 13 is a square, the planar shape thereof may be a rectangle.

In First Embodiment, the thickness of the semiconductor substrate (semiconductor wafer) 12S is subsequently made small by grinding the back surface thereof, and then the semiconductor substrate 12S is diced, whereby the semiconductor chip 12 as illustrated in FIGS. 1 and 2, in which a plurality of the pads PD are formed in the peripheral portion of the main surface, is obtained.

<Manufacturing Method of Semiconductor Device>

Next, a method of manufacturing a semiconductor device of First Embodiment configured as described above will be described.

2-1. Die Bonding Step

Figure 15:
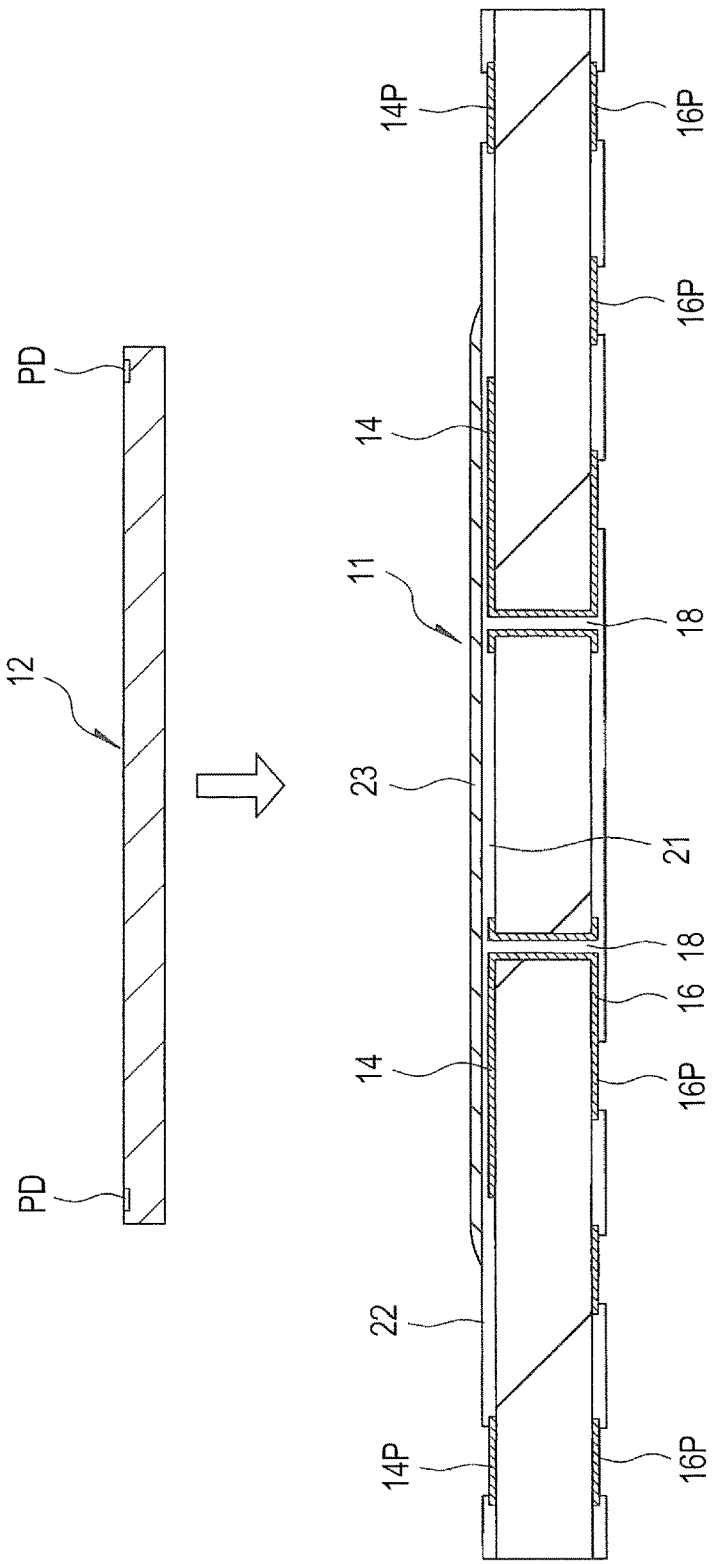
FIG. 15 is a sectional view illustrating a method of manufacturing the semiconductor device, following FIG. 12.

First, the wiring board 11 illustrated in FIG. 15 is provided, and the semiconductor chip 12 (semiconductor chip 12 having the pads PD illustrated in FIGS. 13 and 14) obtained by performing the above steps is mounted (die bonded) over (to) the central portion (chip mounting region) of the upper surface of the wiring board 11 via a die bonding material 23.

In this embodiment, the wiring board 11 having one chip mounting region is illustrated. However, a large substrate (also referred to as a map substrate) is provided which has a plurality of chip mounting regions and in which the conductor pattern (the upper surface wiring 14, lower surface wiring 16, through-hole 18, bonding lead 14P, bump land 16, and the like) of the wiring board 11 is repeatedly formed, and the semiconductor chip 12 may be mounted in the each chip mounting region of the map substrate.

2-2. Wire Bonding Step

Figure 16:
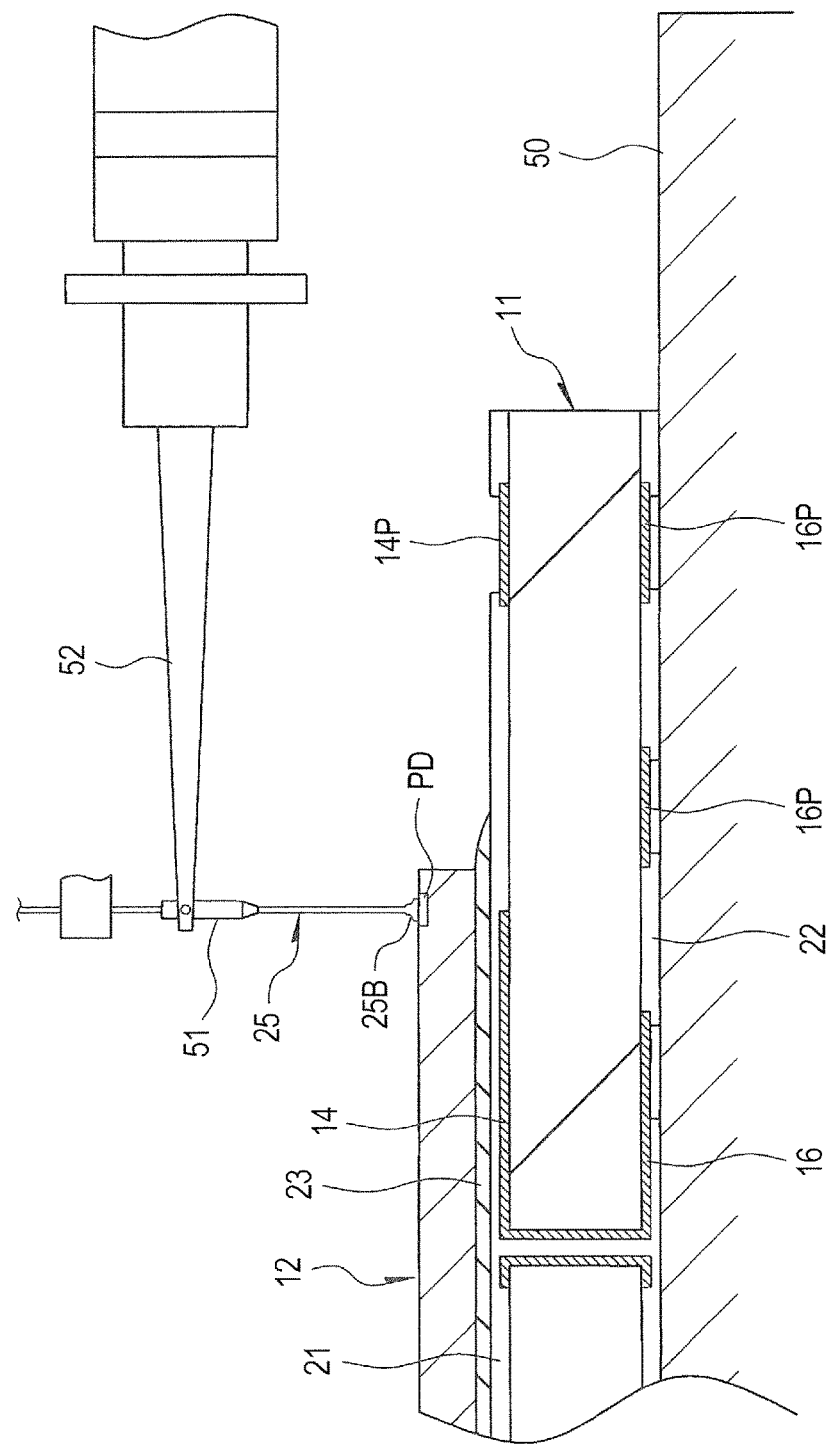
FIG. 16 is a sectional view illustrating a method of manufacturing the semiconductor device, following FIG. 15.

Next, each of the pads PD formed in the semiconductor chip 12 and each of the bonding leads 14P formed in the wiring board 11 are electrically connected with each other by the wire 25 including copper. In this wire bonding step, the wire 25 is bonded by a thermocompression bonding process as illustrated in FIG. 16, in which ultrasonic waves are used in combination.

Specifically, a capillary 51 is first arranged above the wiring board 11 positioned over a stage 50 of a wire bonding apparatus. The capillary 51 reciprocates along a first direction (first horizontal direction, left-right direction in FIG. 16) parallel to the wire bonding surface of the pad PD formed in the semiconductor chip 12 mounted over the wiring board 11, and the stage reciprocates along a second direction (second horizontal direction, direction perpendicular to the paper surface of FIG. 16) that is parallel to the wire bonding surface of the pad PD and intersects with the first direction.

Next, the capillary 51, to which ultrasonic waves are applied through a metal horn 52, is lowered vertically with respect to the wire bonding surface of the pad PD of the semiconductor chip 12, and a first portion (ball portion 25B) of the wire 25 supported by the capillary 51 is pressure-bonded to the wire bonding surface of the pad PD.

Subsequently, the capillary 51 is moved above the bonding lead 14P of the wiring board 11, and a second portion (stitch portion) of the wire 25 is rubbed against the surface of the bonding lead 14P, while sliding the capillary 51. Thereby, the pads PD of the semiconductor chip 12 and the bonding leads 14P of the wiring board 11 are electrically connected with each other via the wires 25.

Herein, an issue, occurring when the ball portion 25B of the copper wire 25 including copper is pressure-bonded to the wire bonding surface (the surface of the first aluminum film 41A) of the pad PD in the present wire bonding step, will be described.

A wire including copper generally has the advantages that the material cost thereof is cheaper than a wire including gold and the electrical property and mechanical property thereof are excellent, but has the characteristic that the ball portion thereof is hard.

Therefore, when the ball portion of a wire including copper is pressure-bonded to the wire bonding surface of the pad by a thermocompression bonding process in which ultrasonic waves are used in combination, splash out occurs by the energy of ultrasonic waves transmitted to the wire bonding surface of the pad through the ball portion, in which part of the pad material (aluminum) of a portion brought into contact with the ball portion is raked out and excluded laterally.

In this case, there is little problem if the area of the wire bonding portion of the pad is large enough in comparison with the diameter of the ball portion of the wire; however, in recent semiconductor devices, the area of the wire bonding portion of a pad becomes smaller with the miniaturization of a semiconductor chip. Therefore, when splash out as described above occurs, the insulating film in the peripheral portion of the pad is easy to be damaged by a pad material piece (aluminum piece) laterally excluded, whereby there is the fear that the protection function of the insulating film may be decreased and the reliability of the semiconductor device may be deteriorated.

Further, in recent semiconductor devices, the interval between adjacent pads is made small with a reduction in the area of the pad, and hence if the insulation film in the peripheral portion of the pad is damaged by splash out, there is a high risk that a short circuit by the laterally excluded aluminum pieces may occur between adjacent pads.

The above splash out is proportional to the thickness of the aluminum film that forms the wire bonding portion of the pad, and as the thickness of the wire bonding portion becomes larger, the amount of aluminum pieces excluded laterally is increased to a higher level. Therefore, it is considered that it is effective, as a measure to suppress the splash out accompanying the use of a wire including copper, to reduce the thickness of the aluminum film that forms the pad.

However, as described above, there is a tendency in the recent semiconductor devices, in which the thickness of an aluminum film, the main conductive film of the uppermost layer wiring, is made larger in order to suppress an increase in electrical resistance accompanying the miniaturization of the line width. For this reason, even in the pad formed in the same layer as the uppermost layer wiring, the thickness of the aluminum film must be increased.

In contrast, in the pad PD of First Embodiment, the thickness of the aluminum film in the wire bonding portion is made smaller than that of the aluminum film in the peripheral portion of the pad PD covered with the protective film 30. As a result, the amount of the aluminum pieces excluded laterally in the wire bonding portion can be reduced when splash out occurs, so that the protective film 30 in the peripheral portion of the pad is hardly damaged even if the area of the wire bonding portion is reduced.

On the other hand, the wiring M3 formed in the same layer as the pad PD has an aluminum film having a larger thickness than the aluminum film that forms the wire bonding portion of the pad PD, and hence high-speed operation of an integrated circuit can be achieved by effectively suppressing an increase in electrical resistance accompanying the miniaturization of the line width.

In First Embodiment, the thickness of the first aluminum film 41A is made larger than that of the second aluminum film 41B, so that the thickness of the wire bonding portion is secured to some extent, even if the main conductive film of the wire bonding portion of the pad PD is formed only by the first aluminum film 41A. In addition, the thickness of the peripheral portion of the pad PD is formed to have a larger thickness than the wire bonding portion thereof, rather than forming the entire pad PD to have a small thickness, in First Embodiment. In other words, the first aluminum film 41A in the portion of the pad PD to which a wire is to be bonded (wire bonding portion) is not completely removed by an etching step, but some of it having a thickness is left, as illustrated in FIG. 14.

Therefore, when the ball portion 25B of the wire 25 is pressure-bonded to the wire bonding portion of the pad PD, the transmission of impacts to the insulating layers 31, 33, and 33 and the wirings M1 and M2, which are located below the pad PD, and further to the semiconductor elements Q1 and Q2 formed in the semiconductor substrate 12S below the layers and the wirings, which may occur when the above bonding is performed, can be suppressed.

2-3. Molding Step

Figure 17:
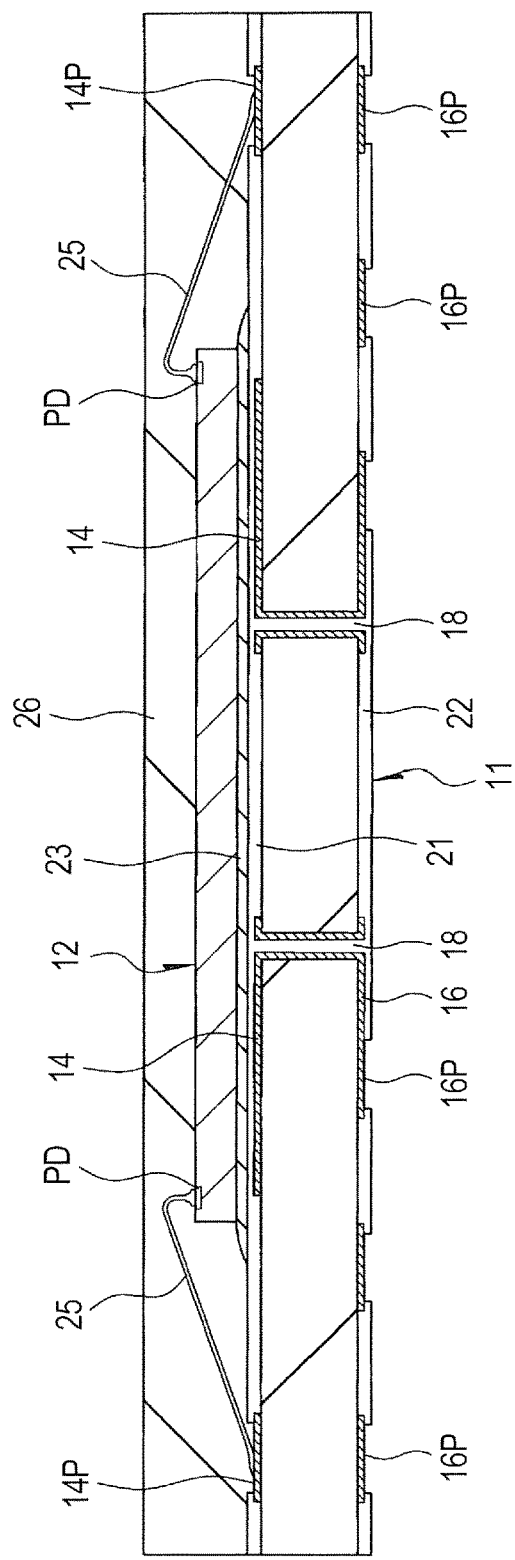
FIG. 17 is a sectional view illustrating a method of manufacturing the semiconductor device, following FIG. 16.

When the above wire bonding step is completed, the wiring board 11 is mounted in a molding die, and the upper surface of the wiring board 11, the semiconductor chip 12, and the wires 25 are sealed with the sealing body 26, as illustrated in FIG. 17.

2-4. Step of Forming External Terminal

Thereafter, the solder balls 13 are connected with a plurality of bump lands (external terminals) 16P formed over the lower surface of the wiring board 11, and then a sorting step for measuring an electrical property is performed by bringing a probe into contact with these solder balls 13, whereby the BGA type semiconductor device 10 illustrated in FIG. 1 is completed. In the case where a plurality of the semiconductor chips 12 are mounted over a large substrate (map substrate), after the solder balls 13 are connected with the bump lands 16P over the lower surface of the large substrate for which the molding step was completed, the large substrate is diced to be individualized into a plurality of the wiring boards 11 and then the above sorting step is performed, whereby the BGA type semiconductor device 10 illustrated in FIG. 1 is completed.

(Second Embodiment)

In First Embodiment described above, it has been described that the first aluminum film 41A is exposed in the wire bonding portion of the pad PD and the ball portion 25B of the wire 25 including copper is directly bonded to the surface of the first aluminum film 41A; however, Second Embodiment is different from First Embodiment in that: after the surface of the first aluminum film 41A that is a main conductive film is exposed as illustrated in FIG. 12 of First Embodiment, a conductive adhesive layer referred to as an OPM (Over Pad Metal) film is formed over the surface of the first aluminum film 41A (wire bonding portion) of the exposed pad PD and a wire is bonded to the OPM film.

Figure 18:
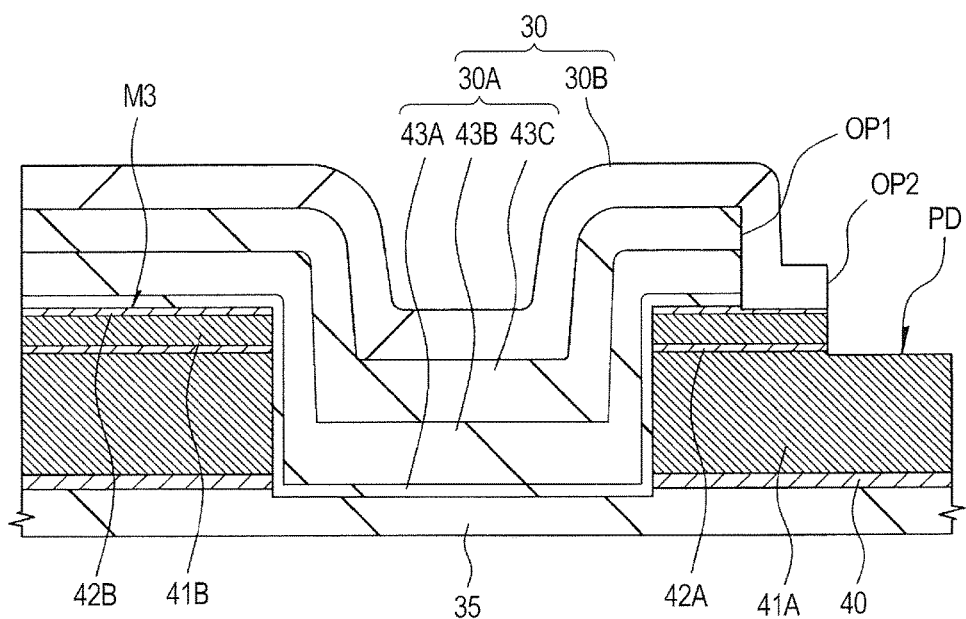
FIG. 18 is a sectional view illustrating a method of manufacturing a semiconductor device according to Second Embodiment.
Figure 19:
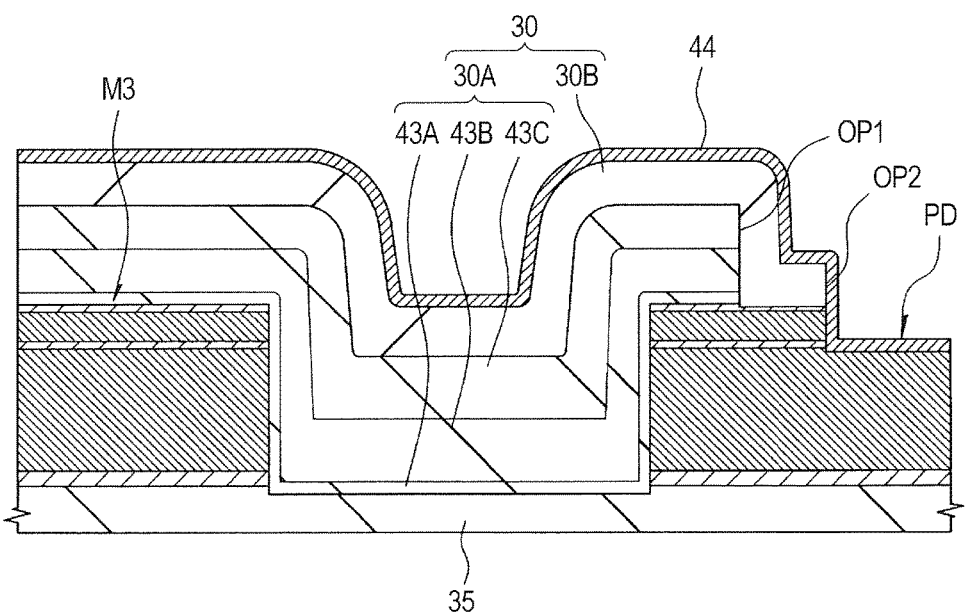
FIG. 19 is an essential-part sectional view illustrating a method of manufacturing the semiconductor device, following FIG. 18.

Specifically, after the first aluminum film 41A is exposed in the wire bonding portion of the pad PD according to the steps illustrated in FIGS. 5 to 12 of First Embodiment, as illustrated in FIG. 18, a conductive adhesive layer 44 covering the wire bonding portion of the pad PD and the protective film 30 is deposited, as illustrated in FIG. 19. The conductive adhesive layer 44 includes a laminated film of, for example, a titanium (Ti) film having a thickness of 0.04 $\mu$m to 0.2 $\mu$m and a palladium (Pd) film that is deposited thereover and has a thickness of 0.04 $\mu$m to 0.2 $\mu$m.

Figure 20:
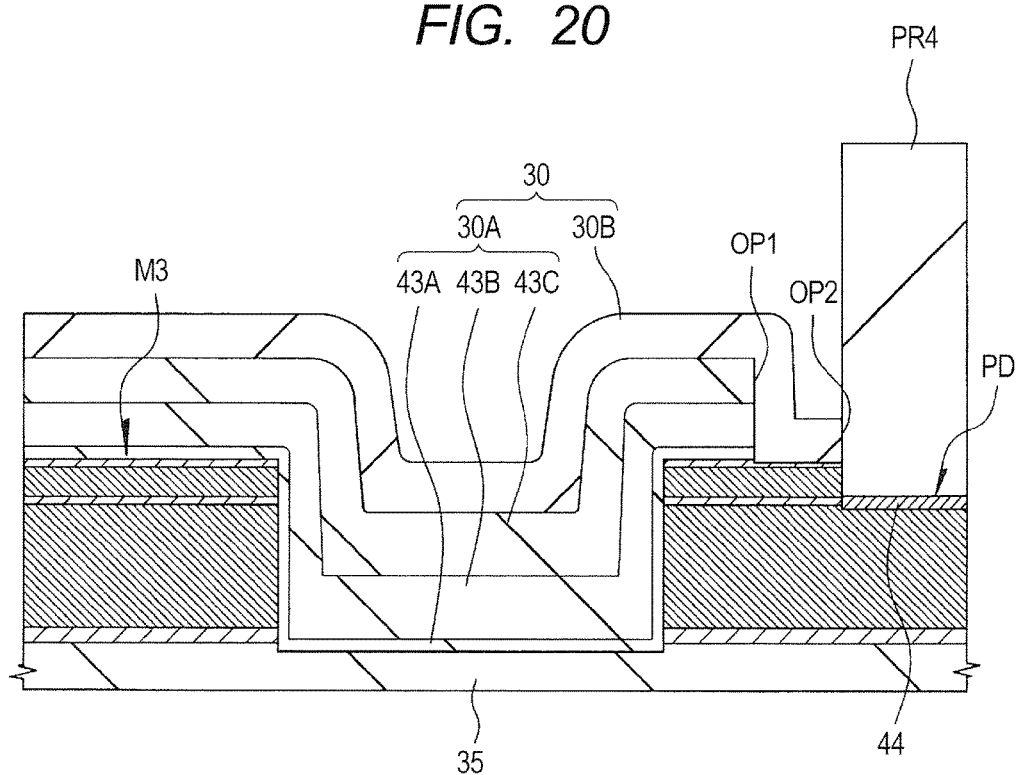
FIG. 20 is an essential-part sectional view illustrating a method of manufacturing the semiconductor device, following FIG. 19.

Thereafter, the conductive adhesive layer 44 is left over the first aluminum film 41A in the wire bonding portion of the pad PD by removing the conductive adhesive layer 44 covering the protective film 30 with the use of dry etching using a photoresist film PR4 as a mask, as illustrated in FIG. 20.

The palladium film, an upper layer film of the conductive adhesive layer 44, has higher reactivity with copper than an aluminum film. The titanium film, which is a lower layer film of the conductive adhesive layer 44, has high reactivity with an aluminum film. Therefore, the bonding strength between the wire 25 including copper and the pad PD can be enhanced by covering the wire bonding portion of the pad PD with the conductive adhesive layer 44.

Thereby, ultrasonic energy to be transmitted to the wire bonding portion of the pad PD can be reduced by lowering the frequency of an ultrasonic wave, which is a factor by which splash out is caused in the wire bonding step.

In the case where the conductive adhesive layer 44 including a palladium film/a titanium film is formed over the surface of the pad including an aluminum film, that is, in the case where the conductive adhesive layer 44 is formed over the surface (wire bonding portion) of the pad exposed from the protective film 30 without performing the steps after FIG. 11 of First Embodiment, the wire bonding step is performed in a state where the thickness of the aluminum film that is softer than the palladium film/titanium film is large; that is, the wire bonding step is performed in a state where the amount (volume) of the aluminum film that is susceptible to the ultrasonic waves applied during the wire bonding is large, and hence there is the fear that the aluminum film may be deformed and the wire bonding portion of the pad may be damaged. On the other hand, in the case where the aluminum film in the wire bonding portion of the pad PD is formed only by one layer of the first aluminum film 41A, occurrence of a damage in the wire bonding portion of the pad PD can be suppressed.

The conductive adhesive layer 44 should not be limited to a palladium film/a titanium film, but may be a laminated film of, for example, a gold film and a titanium tungsten (TiW) film, that of a gold film, a nickel (Ni) film, a copper film, and a titanium film, or the like.

The invention made by the present inventors has been specifically described above based on its preferred embodiments, but it is needless to say that the invention should not be limited to the embodiments and may be modified variously within a range not departing from the gist thereof.

(First Variation)

For example, in First Embodiment, the wiring board 11 is illustrated as a base material over which the semiconductor device 10 is to be mounted, but a lead frame may also be used as the base material.

Figure 21:
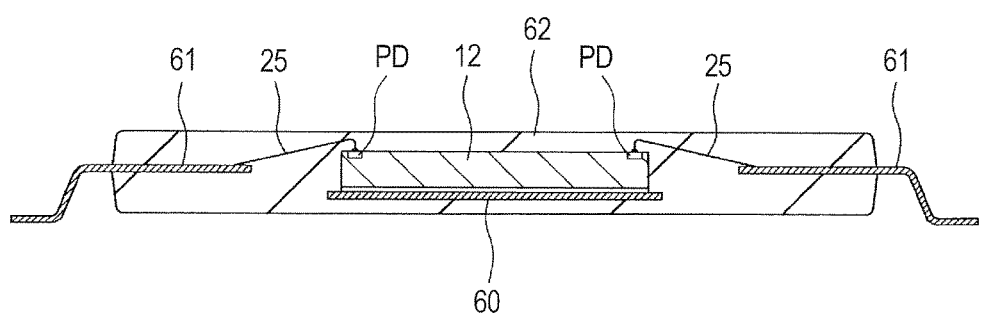
FIG. 21 is a sectional view illustrating a semiconductor device according to First Variation.

That is, the structure of the pad PD of First Embodiment can also be applied to a semiconductor device having a package structure in which: after the first portion (ball portion) of the wire 25 including copper is bonded to the pad PD of the semiconductor chip 12 mounted over a die pad portion 60 of a lead frame and the second portion (stitch portion) of the wire 25 is bonded to a lead 61 of the lead frame, the die pad portion 60 of the lead frame, part of the lead 61, the semiconductor chip 12, and the wire 25 are sealed with a sealing body 62, as illustrated in FIG. 21.

(Second Variation)

In addition, in First Embodiment, an example has been described, in which a plurality of the pads PD are arranged over the main surface of the semiconductor chip 12 and in the peripheral portion of the main surface, but the pads PD may be arranged over the main surface of the semiconductor chip 12 and near the central portion of the main surface. In this case, the wiring M3 is located between the pads and the side of the semiconductor chip 12 in plan view. Further, the wirings M3 may be arranged in both the peripheral portion and the central portion of the main surface of the semiconductor chip 12.

(Third Variation)

Furthermore, for example, various variations have been described above, but combinations of the above variations can be applied.

In addition, the following invention is also disclosed in the above embodiments.

[Additional Remarks]

A semiconductor device including:
a base material having a terminal;
a semiconductor chip that is mounted over the base material and has a pad and a wiring in a main surface; and
a wire including copper that electrically connects the pad of the semiconductor chip with the terminal of the base material,
in which the semiconductor chip includes:
an insulating layer;
the pad formed over a surface of the insulating layer;
the wiring formed over the surface of the insulating layer; and
an insulating film formed over the insulating layer such that the insulating film exposes a part of the pad and such that the insulating film covers the wiring, and
in which in the pad of the semiconductor chip, a thickness of the part exposed from the insulating layer is smaller than a thickness of the part covered with the insulating layer.

What is claimed is:

1. A method of manufacturing a semiconductor device, comprising the steps of:
   (a) mounting a semiconductor chip having a pad and a wiring over a base material; and
   (b) after the step (a), electrically connecting the pad of the semiconductor chip with a terminal of the base material via a wire comprised of copper,
   wherein the semiconductor chip has:
   an insulating layer,
   the pad formed on a surface of the insulating layer,
   the wiring formed on the surface of the insulating layer, and
   an insulating film formed on the surface of the insulating layer such that the insulating film exposes a part of the pad, and such that the insulating film covers the wiring,
   wherein the pad of the semiconductor chip is manufactured by the following steps (a-1) to (a-5) of:
   (a-1) forming a laminated film over the surface of the insulating layer, the laminated film having a first conductive layer comprised of aluminum, a second conductive layer comprised of a material different from the first conductive layer and stacked over the first conductive layer, and a third conductive layer comprised of the same material as the first conductive layer and stacked over the second conductive layer,
   (a-2) after the step (a-1), forming the pad having the first to the third conductive layers and the wiring having the first to the third conductive layers by patterning the laminated film,
   (a-3) after the step (a-2), forming the insulating film over the surface of the insulating layer such that the insulating film covers the pad and the wiring,
   (a-4) after the step (a-3), exposing the part of the pad from the insulating film by patterning the insulating film, and
   (a-5) after the step (a-4), exposing the first conductive layer of the pad by etching the part of the pad exposed from the insulating film, and
   wherein, in the step (b), a first portion of the wire is connected to a surface of the first conductive layer of the pad exposed from the insulating film.

2. The method of manufacturing a semiconductor device according to claim 1,
   wherein in the step (b), the first portion of the wire is connected to the surface of the first conductive layer of the pad exposed from the insulating film, while applying supersonic waves to the wire.

3. The method of manufacturing a semiconductor device according to claim 1, further comprising the step of:

after the step (a-5), forming a conductive adhesive layer over the surface of the first conductive layer exposed in the part of the pad.

4. The method of manufacturing a semiconductor device according to claim 3,
wherein the conductive adhesive layer contains palladium.

5. The method of manufacturing a semiconductor device according to claim 1,
wherein, by the step (a-5), a peripheral portion of the pad is formed to have a thickness larger than that of a central portion of the pad.

6. The method of manufacturing a semiconductor device according to claim 1,
wherein the semiconductor device further includes a fourth conductive layer comprised of the same material as the second conductive layer and stacked over the third conductive layer.

7. The method of manufacturing a semiconductor device according to claim 6,
wherein the second conductive layer and the fourth conductive layer include titanium nitride.

8. The method of manufacturing a semiconductor device according to claim 1,
wherein the first conductive layer is formed to have a thickness larger than that of the third conductive layer.

* * * * *